United States Patent [19]
Ning

[11] Patent Number: 5,256,896
[45] Date of Patent: Oct. 26, 1993

[54] POLYSILICON-COLLECTOR-ON-INSULATOR POLYSILICON-EMITTER BIPOLAR TRANSISTOR

[75] Inventor: Tak H. Ning, Yorktown Heights, N.Y.

[73] Assignee: International Business Machines Corporation, Armonk, N.Y.

[21] Appl. No.: 753,278

[22] Filed: Aug. 30, 1991

[51] Int. Cl.$^5$ ............................................. H01L 29/72
[52] U.S. Cl. ...................................... 257/585; 257/565
[58] Field of Search ................... 357/34, 594; 257/565, 257/585, 588

[56] References Cited
U.S. PATENT DOCUMENTS 4,532,003  7/1985  Beasom ................................. 156/648
5,111,269  5/1992  Tsugaru ................................. 357/34

FOREIGN PATENT DOCUMENTS 0170250  2/1986  European Pat. Off. .
0212707  3/1987  European Pat. Off. .
0323549  12/1989  European Pat. Off. .
2181889  4/1987  United Kingdom .

OTHER PUBLICATIONS

M. D. Hulvey et al, "Dielectric Isolation Process", *IBM Technical Disclosure Bulletin*, vol. 24, No. 11A, Apr. 1982, pp. 5458-5459.

*Primary Examiner*—James W. Davie
*Attorney, Agent, or Firm*—Daniel P. Morris

[57] ABSTRACT

A bipolar transistor is described having a thin subcollector formed from alternating polycrystalline semiconductor material and silicide material disposed over an insulating layer. Because the subcollector is thin the transistor is less sensitive to alpha-particle events. The transistor has enhanced inverse current gain since there is a polycrystalline contact to the inverse emitter.

16 Claims, 3 Drawing Sheets

POLYSILICON-COLLECTOR-ON-INSULATOR POLYSILICON-EMITTER BIPOLAR TRANSISTOR

DESCRIPTION

1. Field of the Invention

This invention relates to a polysilicon-emitter bipolar transistor which is formed on an insulator, is completely surrounded by insulation, includes a heavily doped polysilicon subcollector and is capable of operating in normal and inverse transistor modes. In addition, the transistor includes a refractory metal silicide layer which minimizes sheet resistance of the adjacent polysilicon subcollector. Finally, a third polysilicon layer, with the sub collector polysilicon layer sandwiches the refractory metal silicide layer and is used to form an oxide region which bonds to a silicon substrate for handling during fabrication. The resulting structure, because of reduced minority carrier lifetime in the polysilicon-silicide-polysilicon composite layer and the abruptness of the transition between the polysilicon subcollector and the adjacent single crystal collector region, is less sensitive to alpha-particle events. Also, in the inverse mode of operation, the polysilicon subcollector acts as an emitter providing increased inverse-mode current gain.

2. Background of the Invention

A polysilicon emitter is used in most, if not all, advanced silicon bipolar transistors. At the same time, a single-crystal collector and subcollector is used in these transistors. A transistor of this kind is shown in FIG. 1 which includes a single-crystal subcollector 5 which is relatively thick compared with the transistor of FIG. 2 making it more susceptible to alpha-particle radiation effects. In addition, the single-crystal subcollector has a relatively higher sheet resistance than a subcollector which includes both a heavily doped polysilicon region and an adjacent layer of refractory metal silicide.

In another prior art approach shown in U.S. Pat. No. 4,393,573 filed Aug. 26, 1980, bipolar transistors are shown disposed in insulated wells. The transistors include collectors to which electrical contact is made via a heavily doped, single crystal region of the same conductivity type as the collector and a single crystal layer which is conformal with the inside of the insulation bounding the wells and the outside of the collector region. While the devices of the reference are electrically isolated, there is no indication that alpha-particle sensitivity, low sheet resistance or inverse transistor mode operation were contemplated. Accordingly, there is no structure present which would accommodate these factors.

IBM Technical Disclosure Bulletin, Vol 24, No. 11A, April 1982, page 5468 in an article entitled "Dielectric Isolation Process" by M. D. Hulvey et al shows a bipolar transistor completely surrounded by insulation but it includes a single-crystal subcollector which was formed by laser recrystallization of a polycrystalline layer. The final structure does not include a composite subcollector like that of the present invention nor is it adaptable for superior inverse mode operation.

U.S. Pat. No. 3,579,058, filed May 18, 1971, shows a flip-chip technique for forming bipolar transistors in device areas completely surrounded by insulation. In this reference, the region immediately beneath p-n junction 12 in FIG. 1g thereof is single-savetal material. The portion of semiconductor layer 5 at 4a in FIG. 1c is also single crystal and remains so in FIG. 1g. The reference, therefore, is relevant to the extent that a portion of the collector outside region 4a is polycrystalline. However, the resulting device doesn't incorporate a composite layer where the subcollector interfaces with the collector at a polycrystalline-single crystal interface. In the reference, the subcollector and collector interface is single crystal with single-crystal. In addition, a refractory metal layer for the reduction of sheet resistance is not included or suggested by the reference.

U.S. Pat. No. 4,581,814, filed Dec. 13, 1984, shows a flip-chip fabrication technique wherein active device regions are spaced from a polysilicon handle by a pair of insulative layers shaped like tubs. The only relevance this reference has is that it shows a flip-chip fabrication technique.

It is, therefore, an object of this invention to provide a bipolar transistor which includes a sandwich of polycrystalline silicon, a refractory metal and polycrystalline silicon in place of the usual single-crystal subcollector.

Another object is to provide a bipolar transistor having a polysilicon subcollector which is less susceptible to alpha-particle radiation than prior-art devices.

Yet another object is to provide a bipolar transistor in which a polycrystalline subcollector has a low sheet resistivity as a result of the presence of an adjacent silicide layer.

These and other features and advantages of the present invention will become more apparent from the following more particular description of the preferred embodiment taken in conjunction with the following briefly described drawings.

BRIEF SUMMARY OF THE INVENTION

The present invention relates to a bipolar transistor which is capable of operating in normal or inverse operating modes. This is facilitated by providing a thin highly-doped polycrystalline silicon subcollector with a thin metal silicide layer adjacent it to improve the subcollector sheet resistance. Another polycrystalline layer bonded to an insulation layer is disposed on another surface of the silicide layer. This insulation layer, along with recessed oxide regions, forms complete electrical isolation of the transistor. The resulting transistor is less susceptible to alpha-particle radiation than prior art devices. Fabrication of the structure is simple in that it requires only the deposition of a composite layer, the forming of an oxide layer on a polycrystalline portion of the composite, the bonding of a "handle" to the oxide layer and flipping the resulting structure over. An initially present substrate is then removed and recessed oxide regions are formed which enclose an active device region by forming oxide through the composite layer down to the oxide layer on which the composite layer rests. Another step which forms oxide down to the surface of the composite layer simultaneously forms-single crystal device and reach-through regions. After this, the regions of the active transistor device are formed using well-known process steps to provide a transistor having less susceptibility to alpha-particle radiation which can operate in normal and reverse modes of operation.

DESCRIPTION OF THE PREFERRED EMBODIMENTS

Figure 1:
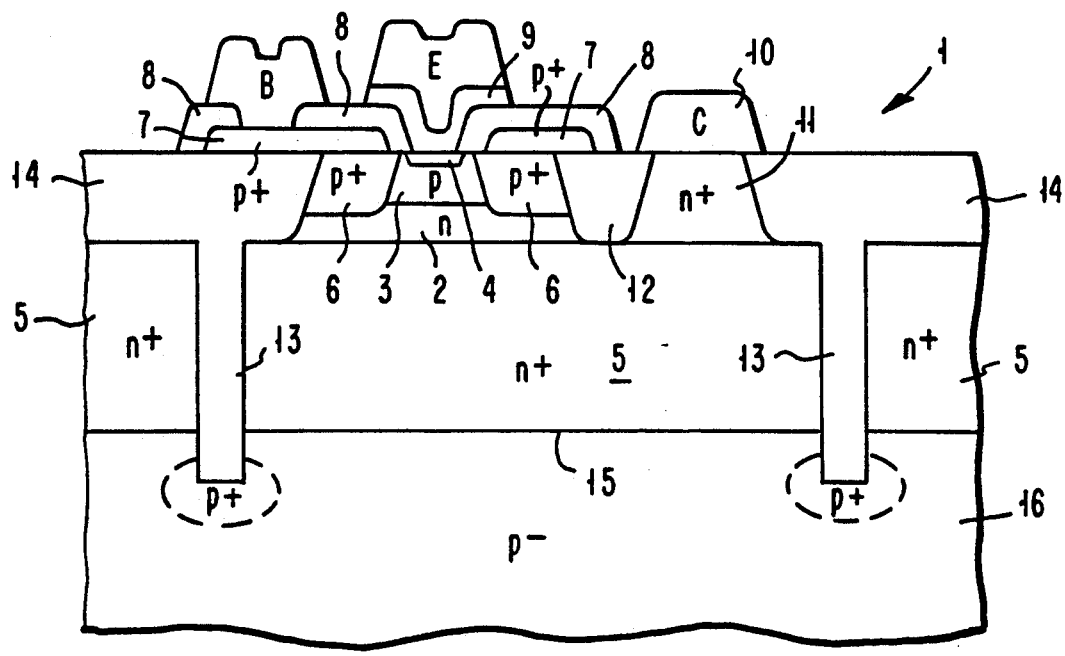
FIG. 1 is a cross-sectional view of a prior art bipolar transistor.

Referring now to FIG. 1, there is shown a cross-sectional view of a prior art bipolar transistor which incorporates a highly doped (n+) subcollector. In FIG. 1, bipolar transistor 1 includes a collector 2, a base 3, an emitter 4 and a heavily doped (n+) subcollector 5. An extrinsic base region 6 is formed by diffusing boron dopant, for example, from overlying polysilicon layers 7 which have been heavily doped with boron to render them p+-conductivity type. Both the top surfaces and vertical edges of polysilicon layers 7 are covered by a layer 8 of insulation, $SiO_2$, for example, which also spaces polysilicon emitter contact 9 from base contact layers 7. Collector contact 10 contacts a collector reach-through region 11 which is disposed over subcollector 5. Reach-through region 11 is spaced from the remainder of transistor 1 by an oxide isolation region 12. Deep trench isolation regions 13 and overlying thin recessed oxide (ROX) regions 14 are formed in the usual way. The electrical isolation of bipolar transistor 1 is completed by p-n junction 15 which extends between a lightly doped (p-) substrate 16 and heavily doped (n+) subcollector 5.

One drawback to the prior art bipolar transistor of FIG. 1 is that the thick layer from which subcollector 5 is formed (including n+/n transition region between subcollector 5 and collector 2) and p-n junction 15 between substrate 16 and subcollector 5 are the most sensitive regions of transistor 1 to alpha-particle events. The bipolar device of FIG. 2, among other things, has a structure wherein the sensitivity to alpha-particle events is minimized.

Figure 2:
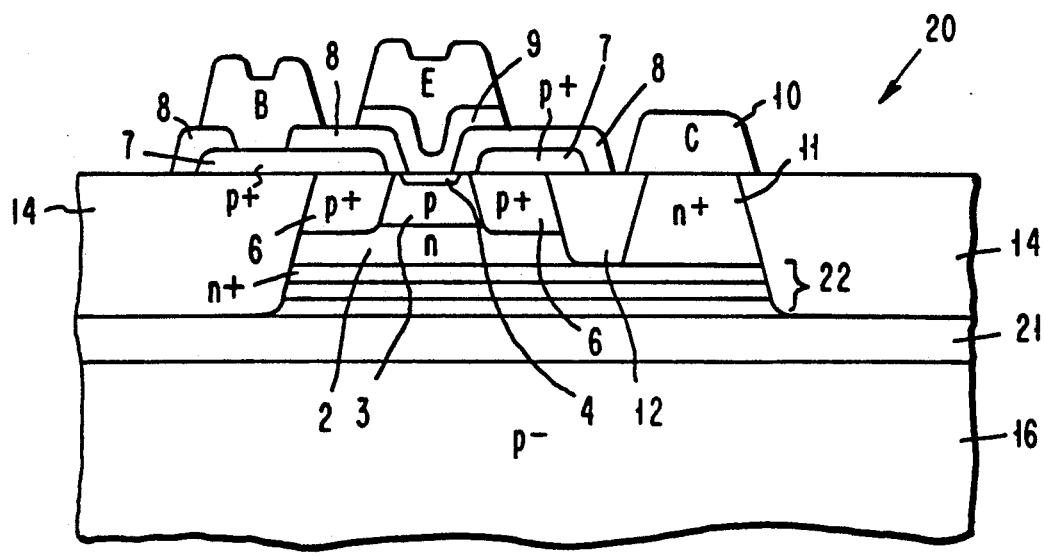
FIG. 2 is a cross-sectional view of the structure of a bipolar transistor in accordance with the teaching of the present application. The transistor is completely surrounded by insulation and includes a polysilicon-silicide-polysilicon sandwich in place of the usual single-crystal semiconductor collector.

FIG. 2 is a cross-sectional view of the structure of a bipolar transistor in accordance with the teaching of the present invention. The transistor shown is completely surrounded by insulation and includes a polysilicon-silicide-polysilicon sandwich in place of the usual single-crystal semiconductor subcollector. The same reference numbers are used in FIG. 1 identify similar elements in FIG. 2. Thus, bipolar transistor 20 of FIG. 2 is identical with transistor 1 of FIG. 1 except that an insulator layer 21 of silicon dioxide, for example, is disposed over substrate 16 and a composite layer 22 of conductive material is disposed on layer 21 which interconnects collector reach-through region 11 and collector 2 of transistor 20. Composite layer 22 is comprised of a layer of a refractory metal silicide, such as tungsten silicide, sandwiched between layers of heavily doped (n+) polycrystalline silicon. Other refractory metals such as molybdenum may be used without departing from the spirit of the invention.

By incorporating composite layer 22 in transistor 20, the resulting device is much less sensitive to alpha-particle impingement than the conventional devices shown in FIG. 1. The thus minimized sensitivity is due to the fact that semiconductor substrate 16 is totally isolated from collector 2 by insulation layer 21 which is disposed between collector 2 and substrate 16. In addition, the shorter minority carrier lifetime in composite layer 22 than in the usual n+-semiconductor subcollector 5 of FIG. 1 makes the collector 2 itself less sensitive to alpha-particle impingement. Finally, the transition between the heavily doped (n+) polycrystalline portion of composite layer 22 and the less heavily doped (n) single-crystal region of collector 2 of FIG. 2 is much thinner and, hence, is less sensitive to alpha-particle impingement than for the usual n+ subcollector of conventional devices.

In the following discussion of FIGS. 3-6, the steps in fabricating the structure of FIG. 2 will be outlined in detail.

Figure 3:
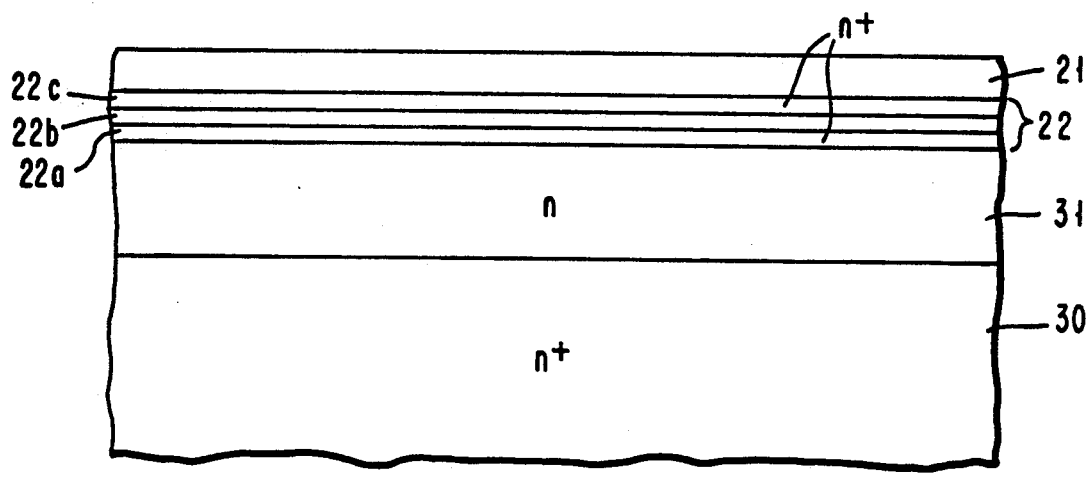
FIG. 3 is a cross-sectional view of the device of FIG. 2 at the first stage of its fabrication showing a polysilicon-silicide-polysilicon composite layer disposed between an n-doped epitaxial layer and an oxide bonding layer.

FIG. 3 is a cross-sectional view of the structure of FIG. 2 at the first stage of its fabrication process. FIG. 3 shows a polysilicon-silicon-polysilicon layer disposed between an n-conductivity type epitaxially deposited layer and an oxide bonding layer.

In FIG. 3, a heavily doped (n+) substrate 30 of silicon semiconductor is shown having a thinner, less heavily doped (n) epitaxial layer 31 deposited on a surface thereof. Substrate 30 should be heavily doped with an n-conductivity type dopant such as arsenic to obtain the sharpest n+/n transition region with epitaxial layer 31 as possible. Epitaxial layer 31 may be grown by any number of epitaxial deposition techniques well-known to those skilled in the semiconductor deposition art. At this point, composite layer 22 is formed over thin epitaxial layer 31 by depositing in succession an n+ polycrystalline silicon layer 22a, a tungsten silicide layer 22b and an n+ polycrystalline layer 22c. Then, layer 21 of insulator is formed over layer 22 for bonding and isolation purposes. For example, layer 21 could be silicon dioxide formed by oxidation of polysilicon layer 22c. The first polycrystalline layer 22a eventually forms a polycrystalline subcollector while the second polycrystalline layer 22c is used to facilitate wafer bonding. Silicide layer 22b is used for reducing collector sheet resistance. It should be noted that the polycrystalline layer 22a which forms the subcollector of transistor 20 is deposited on n-epitaxial layer 31 rather than grown on the usual n+-subcollector at rather higher temperatures. As a result, the n+/n transition mentioned above should be sharper for the polysilicon subcollector than for the conventional n+-subcollector. Composite layer 22 is deposited by conventional methods well-known to those skilled in the semiconductor arts.

Figure 4:
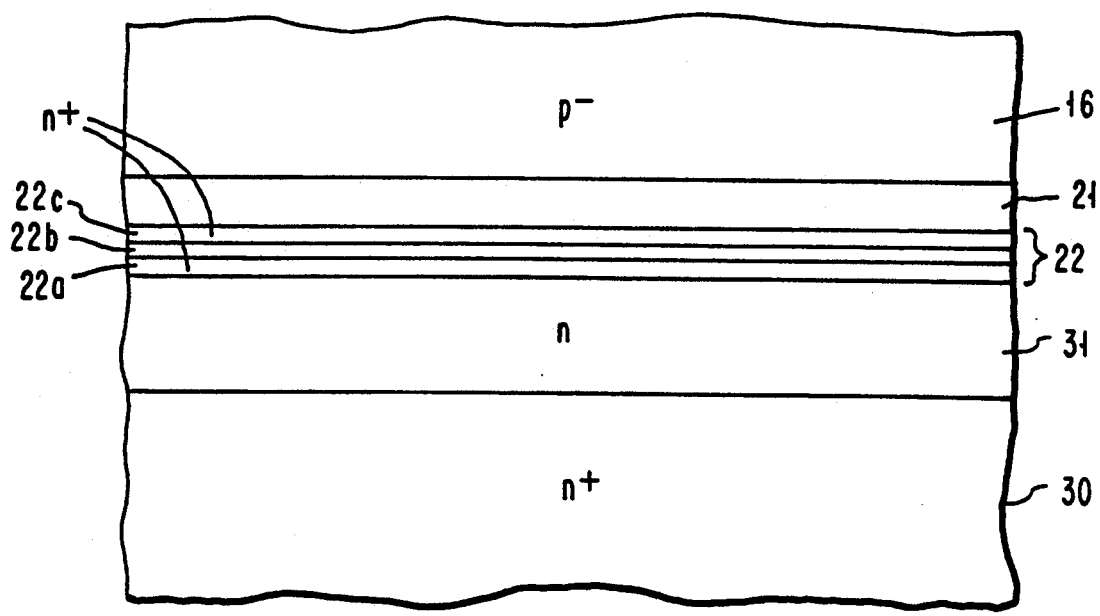
FIG. 4 is a cross-sectional view of FIG. 3 at a later stage in its fabrication showing the bonding of a substrate wafer or "handle" to the structure of FIG. 3.

FIG. 4 is a cross-sectional view of FIG. 3 at a later stage in its fabrication showing the bonding of a substrate wafer or "handle" to the structure of FIG. 3. In FIG. 3, substrate 16, a surface of which may have been previously oxidized, is shown bonded to oxide layer 21. The bonding step is carried out using a prior art technique described in an article entitled "Silicon-On- Insulator (SOI) By Bonding and Etch-Back" by J. B. Lasky et al, IEDM 85, pages 684–687, which is incorporated herein by reference. Briefly, bonding is achieved by pressing the oxidized surfaces of two semiconductor wafers together and introducing them into an oxidizing atmosphere at a temperature of greater than 700° C. According to the article, bonding has been demonstrated with thermally grown oxide thicknesses ranging from native oxide to 520 nm on either or both wafers. In the present instance, substrate 16 is bonded to oxide layer 21, the former providing a "handle" for further processing of transistor 20. At this juncture, $n^+$ substrate 30 is subjected to a combination of chemical-mechanical polishing and preferential etching steps to totally remove it. The chemical-mechanical polishing and etching steps are well-known to those skilled in the semiconductor arts. For example, the mixture $HF:HNO_3:CH_3COOH = 1:3:8$ with $H_2O_2$ added as oxidizing agent etches heavily dope silicon preferentially. A commonly used chemical-mechanical polishing agent is a slurry composed of a colloidal suspension of fine $SiO_2$ particles, typically 10 nm diameter, in an aqueous solution of sodium hydroxide. After these steps, the wafer is flipped over so that the now exposed surface of n-epitaxial layer 31 is available for further processing.

Figure 5:
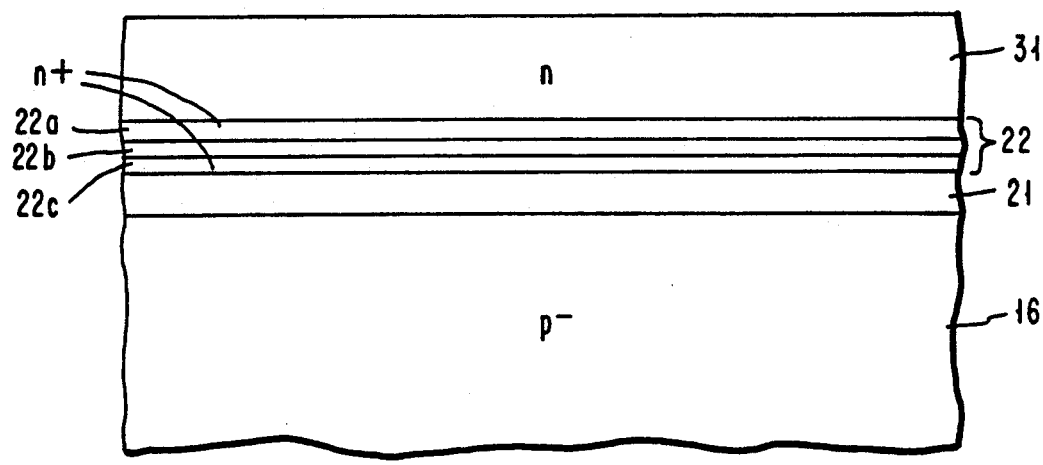
FIG. 5 is a cross-sectional view of the structure of FIG. 4 after it has been flipped and the n+-doped substrate layer etched away, leaving behind the n-doped epitaxial layer in which to form a bipolar device.

FIG. 5 is a cross-sectional view of the structure of FIG. 4 after it has been flipped, exposing epitaxial layer 31 for the fabrication of a bipolar transistor 20 therein.

Figure 6:
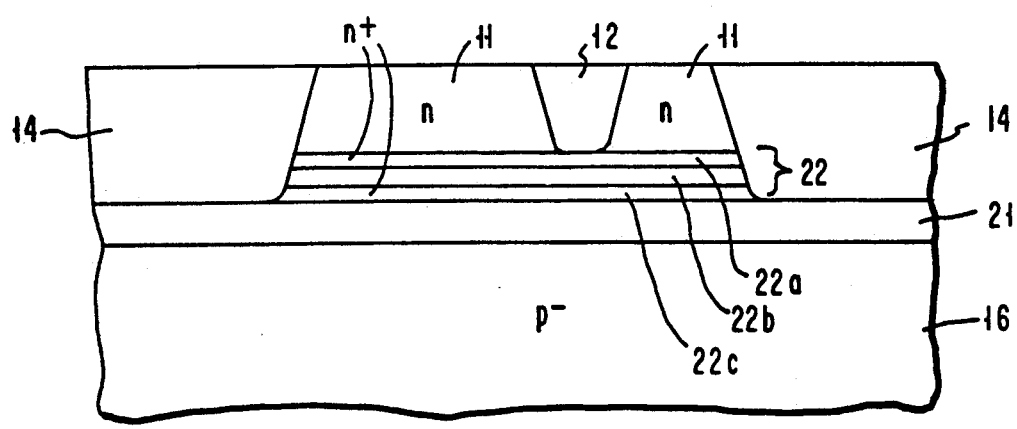
FIG. 6 is a cross-sectional view of the structure of FIG. 5 at an intermediate stage in its fabrication process showing the formation of insulation regions which surround the bipolar transistor of FIG. 2.

Referring now to FIG. 6, there is shown a cross-sectional view of the structure of FIG. 5 at an intermediate stage in its fabrication process wherein insulation regions have been formed to surround the bipolar transistor of FIG. 2.

FIG. 6 shows n epitaxial layer 31 after it has been subjected to masking and oxidation steps which form thick and thin recessed oxide regions 14 and 12, respectively. Oxide regions 14 are formed by a thermal growth step for a time sufficient to permit the bottoms of regions 14 to intersect oxide layer 21. Oxide region 12 is thinner than oxide region 14 and is formed in epitaxial layer 31 to define both collector reach-through 11 and another epitaxial region in which the remainder of transistor 20 is to be formed.

The depth of oxide region 12 is controlled so that it just touches polycrystalline layer 22a. It should be noted, at this point, that the epitaxial region in which emitter 4, base 3 and collector 2 will be formed, along with region 12 composite layer 22, are now completely surrounded by insulation.

Alternatively, oxide regions 12 and 14 could be formed by first etchin away the silicon, followed by oxide deposition and etch back planarization, as described by B. Davan et al., in IEDM 89, p. 61.

Once the thick and thin recessed oxide regions have been formed, the fabrication of the remainder of transistor 20 may be carried out using well-known prior art masking, etching and diffusion steps. Briefly, a layer of $p^+$-conductivity type polycrystalline silicon is deposited, masked, etched and oxidized to form an aperture in the polycrystalline layer. The remainder of the latter forms polycrystalline layers 7 which are covered with oxide 8. The structure is then subjected to an out-diffusion heating step which forms $p^+$ extrinsic base regions 6. Intrinsic base 3 may then be formed using well-known ion implantation or diffusion technique to provide a p-conductivity type region between extrinsic base regions 6. In subsequent steps, a layer of $n^+$ conductivity type polycrystalline silicon a is conformally deposited in the previously formed aperture, masked and etched and subjected to an out-diffusion step to form emitter 4. After this contact metallization to the various regions of transistor 20 is applied in the usual way resulting in the structure of FIG. 2.

Typical thicknesses for the layers of composite layer 22 and oxide layer 21 are:
21—100–500 nm
22a—100 nm
22b—100 nm
22c—100 nm In transistor 20, a typical sheet resistance for subcollector composite layer 22 is: 5 ohm/square.

While transistor 20 of FIG. 2 has about the same performance as the conventional transistor, it does have better inverse-mode current gain, since, in the inverse mode, the lower $n^+$ polysilicon layer 22c acts as an emitter. The structure of FIG. 2 has a polycrystalline layer 9 forming the normal emitter and a polycrystalline layer 22a forming the inverse emitter 2. As indicated previously, the most important advantage of the polysilicon collector-on-insulator transistor is the reduction in sensitivity to alpha-particle effects.

Also, while transistor 20 has been described as an npn bipolar transistor, it should be appreciated that transistor 20 may be a pnp device with $p^+$-conductivity type layers in composite layer 22.

Having thus described my invention what I claim as new and desire to secure as Letters Patent, is:

1. A bipolar transistor, having an emitter region, a base region and a collector region, capable of operating in normal or inverse operating modes, said bipolar transistor having a subcollector, comprising:
   a first single crystal semiconductor region of a first conductivity type,
   a second single crystal semiconductor region of second conductivity type disposed in said first region forming a p-n junction with said first region,
   a third single crystal semiconductor region of said first conductivity type having a given dopant concentration therein forming a p-n junction with said second region, and,
   a layer of polycrystalline semiconductor material of said first conductivity type having a dopant concentration therein much higher than said given concentration forming an abrupt junction with said third region.

2. A bipolar transistor according to claim 1 wherein said first, second and third semiconductor regions are n-conductivity type silicon, p-conductivity type silicon and n-conductivity type silicon, respectively.

3. A bipolar transistor according to claim 1 wherein said first, second and third semiconductor regions are p-conductivity type silicon, n-conductivity type silicon and p-conductivity type silicon, respectively.

4. A bipolar transistor according to claim 1 wherein said first conductivity type is n-conductivity type silicon and said first polycrystalline layer is n-conductivity type silicon.

5. A bipolar transistor according to claim 1 wherein said first conductivity type is p-conductivity type silicon and said first layer of polycrystalline semiconductor material is n-conductivity type silicon.

6. A bipolar transistor according to claim 1 further including a single crystal semiconductor reach-through region of said first conductivity type disposed in insulated spaced relationship with said first, second and third region a portion of said reach-through regions contacting said layer of polycrystalline semiconductor material.

7. A bipolar transistor according to claim 6 further including a layer of a refractory metal silicide disposed adjacent said polycrystalline semiconductor layer.

8. A bipolar transistor according to claim 7 further including another layer of a heavily doped polycrystalline semiconductor material disposed adjacent said layer of refractory metal silicide.

9. A bipolar transistor according to claim 7 wherein said refractory metal silicide is tungsten silicide.

10. A bipolar transistor according to claim 8 further including a layer of insulating material a surface of which is disposed adjacent said another layer of polycrystalline semiconductor material and in bonded relationship with said another polycrystalline layer.

11. A bipolar transistor according to claim 8 wherein said another layer of heavily doped polycrystalline semiconductor material is of the same conductivity type as said layer of polycrystalline semiconductor material.

12. A bipolar transistor according to claim 10 wherein said layer of insulating material is a grown layer of silicon dioxide.

13. A bipolar transistor according to claim 10 further including an isolation region disposed on said layer of insulating material and in surrounding relationship with said first, second and third semiconductor regions, said reach-through region, said layer of refractory metal and said layer and said another layer of polycrystalline semiconductor material.

14. A bipolar transistor according to claim 13 wherein said isolation region is silicon dioxide and said reach-through region is single-crystal silicon.

15. A bipolar transistor, having an emitter region, a base region and a collector region, capable of operating in normal or inverse operating modes, said bipolar transistor having a subcollector, comprising:
    a first single crystal semiconductor region of a first conductivity type,
    a first layer of polycrystalline semiconductor material of said first conductivity type on top of and adjacent to said first single crystal region,
    a second single crystal semiconductor region of second conductivity type disposed in said first region forming a p-n junction with said first region,
    a third single crystal semiconductor region of said first conductivity type having a given dopant concentration therein forming a p-n junction with said second region, and,
    a second layer of polycrstalline semiconductor material of said first conductivity type having a dopant concentration therein much higher than said given concentration forming an abrupt junction with said third region.

16. A bipolar transistor, having an emitter region, a base region and a collector region, capable of operating in normal or inverse operating mode, said bipolar transistor having a subcollector, comprising:
    a first single crystal semiconductor region of a first conductivity type;
    a second single crystal semiconductor region of second conductivity type disposed in said first region forming a p-n junction with said first region,
    a third single crystal semiconductor region of said first conductivity type having a given dopant concentration therein forming a p-n junction with said second region,
    a layer of polycrystalline semiconductor material of said first conductivity type having a dopant concentration therein much higher than said given concentration forming an abrupt junction with said third region,
    a single crystal semiconductor reach-through region of said first conductivity type disposed in insulated spaced relationship with said first, second and third regions a portion of said reach-through regions contacting said layer of polycrystalline semiconductor material,
    a layer of a refractory metal silicide disposed adjacent said polycrystalline semiconductor layer,
    another layer of a heavily doped polycrystalline semiconductor material disposed adjacent said layer of refractory metal silicide,
    a layer of insulating material a surface of which is disposed adjacent said another layer of polycrystalline semiconductor material and in bonded relationship with said another polycrystalline layer, and
    an isolation region disposed on said layer of insulating material and in surrounding relationship with said first, second and third semiconductor regions, said reach-through region, said layer of refractory metal and said layer polycrystalline semiconductor material and said another layer of polycrystalline semiconductor material.

* * * * *